(12) United States Patent
Tseng et al.

(10) Patent No.: US 11,993,854 B2
(45) Date of Patent: May 28, 2024

(54) CHAMBER WALL POLYMER PROTECTION SYSTEM AND METHOD

(71) Applicant: Taiwan Semiconductor Manufacturing Company, Ltd., Hsinchu (TW)

(72) Inventors: Po-Hsun Tseng, New Taipei (TW); Yan-Hong Liu, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/679,537

(22) Filed: Feb. 24, 2022

(65) Prior Publication Data

US 2023/0151494 A1     May 18, 2023

Related U.S. Application Data

(60) Provisional application No. 63/279,758, filed on Nov. 16, 2021.

(51) Int. Cl.
    *C23F 1/08*         (2006.01)
    *B01J 19/00*       (2006.01)
    *B01J 19/10*       (2006.01)
    *H01L 21/3065*    (2006.01)

(52) U.S. Cl.
CPC ............. *C23F 1/08* (2013.01); *B01J 19/0053* (2013.01); *B01J 19/10* (2013.01); *H01L 21/3065* (2013.01)

(58) Field of Classification Search
None
See application file for complete search history.

(56) References Cited

U.S. PATENT DOCUMENTS 5,367,139 A * 11/1994 Bennett .................. C23C 16/44
                                                      204/298.31
2007/0235058 A1* 10/2007 Harrington ............. B08B 7/028
                                                          134/1

* cited by examiner

*Primary Examiner* — Stephanie P Duclair
(74) *Attorney, Agent, or Firm* — Lippes Mathias LLP

(57) ABSTRACT

In an etch process chamber, oscillators are positioned a predetermined distance away from an outer wall and coupled to a microwave generator. An inner wall of the process chamber on which particulates such as polymers adhere from the etch process is vibrated via operations of the oscillators. A gas flows into the cavity defined by the inner wall to collect the displaced particulates, which is then pumped out of the cavity to clean the process chamber. A controller identifies the polymer recipe used during the etch process and selects an oscillation program from memory. A microwave generator, controlled by the controller, is directed to generate microwaves at preselected frequencies determined from the program. The microwave frequencies are communicated to the oscillators, which then vibrate the inner wall at such received frequencies.

20 Claims, 5 Drawing Sheets

CHAMBER WALL POLYMER PROTECTION SYSTEM AND METHOD

PRIORITY CLAIM AND CROSS-REFERENCE

This application claims the benefit of U.S. Provisional Application Ser. No. 63/279,758 filed Nov. 16, 2021, and titled CHAMBER WALL POLYMER PROTECTION SYSTEM AND METHOD. U.S. Provisional U.S. Provisional Application Ser. No. 63/279,758 filed Nov. 16, 2021 and titled CHAMBER WALL PROTECTION SYSTEM AND METHOD is incorporated herein by reference in its entirety.

BACKGROUND

The following relates to systems and methods for removal of particles, such as polymer particles, remaining in an etching chamber after processing. Integrated circuits are formed on a semiconductor substrate, which is typically comprised of silicon. Such formation involves sequential deposition of various materials in layers or films, e.g. conductive and nonconductive layers. Etching processes may be used to form geometric patterns in the layers or vias for electrical contact between the layers. Etching processes may include "wet" etching, wherein a solvent or chemical reagent is used, or "dry" etching, wherein plasma is used. Such processes produce extraneous particles which may remain in the chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
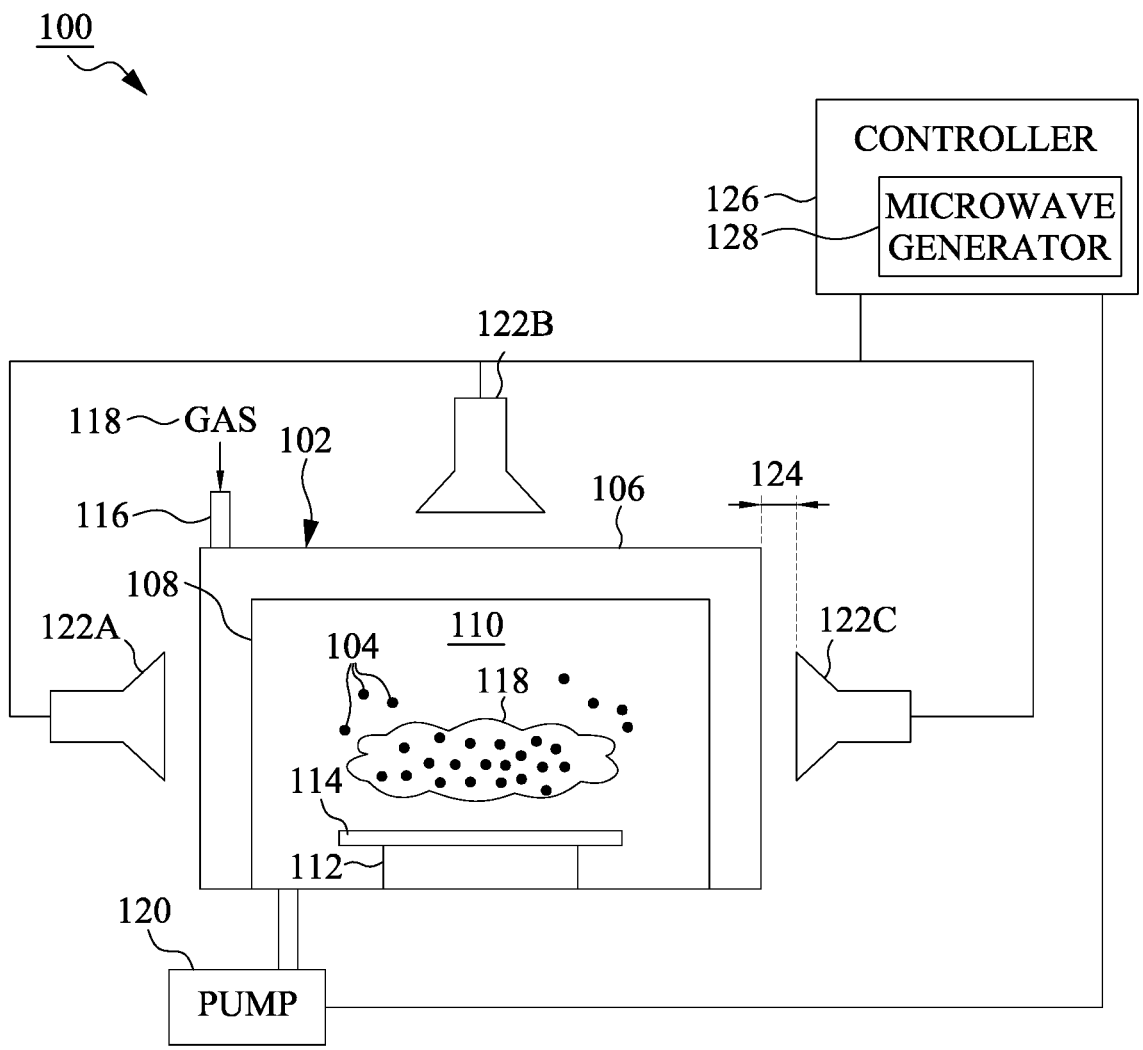
FIG. 1 diagrammatically illustrates a system for removal of particulates from an etch process chamber in accordance with one embodiment of the subject application.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Dry etching processes, also referred to as plasma etching processes, are carried out to etch various films at various stages of the semiconductor manufacturing operation and produce various device features. Multiple plasma etching operations are sometimes used during fabrication of a semiconductor device. One shortcoming of such plasma etching operations is the generation of polymers as etch by-products within the etching chamber. The polymers can adhere to various surfaces within the etch chamber and become dislodged, contaminating the chamber. One particularly prevalent and problematic location where polymer buildup is common, are the inside walls of the etching chamber. When a polymer film is formed on the inside walls of the etching chamber, any uncontrolled or unintentional movements may cause the polymeric film to delaminate and flake from the walls. This generates particles that may fall immediately on the top, i.e. the device side of a substrate or contaminate the chamber in which the substrate is located, which may ultimately result in device contamination and failure.

Turning now to FIG. 1, there is shown an exemplary system 100 for removal of particulates (e.g., polymers) 104 from the inside of an etching chamber 102. As used herein, the terms "particulate" and "polymer" are used to refer to particles left after the etching process within the chamber that require removal. The reference to "polymers" is intended to provide one particular example of such particles, and other materials may remain after an etching process that may be removed in accordance with the systems and methods set forth herein.

The chamber 102 includes an outer wall 106 and an inner wall 108, the inner wall 108 defining a cavity 110 in which etching processes may be performed. Typically, the cavity 110 is sealed, except for possible gas inlets/outlet and/or a pump connection, so that the cavity 110 can contain a controlled atmosphere at a controlled pressure. The chamber 102 includes an electrostatic chuck (ESC) or other type of wafer mount 112 disposed within the cavity 110 and configured to retain a semiconductor wafer 114 therein. In an etching process for polysilicon or metal surfaces, a chlorine etching gas is frequently used. On the other hand, the etching gas used for oxide or nitride surfaces is frequently fluorine gas. These are merely nonlimiting illustrative examples. During a plasma etching process, the reactive plasma ions have a high energy level and therefore can easily combine with any available chemical molecules or elements in the chamber 102 to form contaminating particles or films. For instance, in a metal etching process, the elements frequently seen in the etch chamber 102 include C, H, N, O, Al, Ti, TiN and Si, and/or molecules including these elements. Different elements such as C, N, O, Br, Si and W are seen in a polysilicon etch chamber. The contaminating particles or films, illustrated in FIG. 1 as the polymers 104, are formed by often volatile chemical molecules or elements during an etching process. The polymers 104 often float or are suspended in the chamber 102 due to the interaction with high energy plasma ion particles when the RF power is on. The phenomenon of the floating or suspended particles 104 can be explained by the fact that the particles 104 have higher energy and temperature while suspended in a plasma cloud. However, at the end of a typical etching process, the RF power is switched off which leads to the sudden loss of energy in the suspended contaminating particles and causing them to fall or stick to the chamber walls 108 or the upper electrode (not shown).

The chamber 102 of FIG. 1 further includes an inlet 116 into which a gas 118 is injected into the chamber 102, collecting some of the polymers 104 within the cavity 110 formed during the etching process. The gas 118 flowing into the cavity 110 may be oxygen, nitrogen, or other suitable gas. While a single inlet 116 is shown by way of illustration, it is contemplated to have multiple inlets, e.g. to admit different gases into the cavity 110, possibly at different flow rates. A pump 120 is positioned outside the chamber 102 and in fluidic connection with the cavity 110. In varying embodiments, the pump 120 is operative to remove the gas 118 and any collected particles 104 from the chamber 102. It will be appreciated that the gas 118 and pump 120 may be operative while a semiconductor wafer 114 is present within the chamber 102. Alternatively, the gas 118 and pump 120 may be operative after the etching process has completed and the semiconductor wafer 114 has been removed.

Positioned outside the chamber 102 are one or more, including a plurality of oscillators 122A, 122B, and 122C. It will be appreciated by those skilled in the art that the number of oscillators 122A-C depicted in FIG. 1 is intended merely to illustrate one example implementation, and the subject systems and methods described herein may include any number of oscillators 122A-C. In some contemplated embodiments, the number of oscillators may be as low as one, i.e. a single oscillator. Furthermore, the positioning of the oscillators 122A-C shown in FIG. 1 is merely intended to illustrate their position outside the chamber 102, and not intended to limit their respective positions with respect to the chamber 102. That is, while shown in FIG. 1 as being located opposite each other and one above the chamber 102, the position of the oscillators 122A-C, along with the number thereof, may vary in accordance with a myriad of factors including, for example and without limitation, the size of the chamber 102, the location of the chamber 102 within a facility, the type of chamber 102, the size and number of the oscillators 122A-C, and the like.

The oscillators 122A-C are positioned outside the outer chamber wall 106, with a suitable gap 124 between the outer wall 106 and each respective oscillator 122A-C. The oscillators 122A-C may be coupled to a frame or jacket (not shown) surrounding the chamber 102, such that the oscillators 122A-C are not in direct or indirect physical contact with the outer chamber wall 106. In accordance with another embodiment, each oscillator 122A-C is individually mounted to the outer chamber wall 106 via a bracket (not shown). In such an embodiment, the bracket (not shown) maintains the position of the respective oscillator 122A-C relative to the chamber 102 and the gap 124. The gap 124 may be an air gap, or may be filled with another medium that transmits the oscillations to the chamber 102. In varying embodiments contemplated herein, the gap 124 between the oscillators 122A-C relative to the outer chamber wall 106 may vary in accordance with the type of oscillator 122A-C used, and in some non-limiting examples, be from 1 mm to 30 mm.

In accordance with one embodiment, the oscillators 122A-C are operated in response to the output of a generator, including microwave generator 128, of a controller 126. The oscillators 122A-C may include, for example and without limitation, a transducer, a piezoelectric element, a vibrator, or the like configured to induce mechanical vibration of the inner wall 108 so as to vibrate polymer particles 104 to dislodge or disperse the particles 104 from the inner chamber wall 108. Upon dispersal from the walls, the polymer particles 104 may be removed from within the cavity 110 of the chamber 102 via operation of the pump 120. In one embodiment, the gas 118 flowing into the cavity 110 collects the polymers 104 displaced from the inner wall 108 via the oscillators 122A-C, whereafter the gas 118 with suspended polymers 104 is removed from the cavity 110 via operations of the pump 120. According to varying embodiments contemplated herein, the one or more oscillators 122A-C may operate in varying sequences, simultaneously, in varying pairs (e.g., opposites), or any such suitable variation of operation where one or more oscillators 122A-C vibrate polymer or other materials 104 loose from the inner chamber wall 108.

According to one or more embodiments, the controller 126 is in communication with the oscillators 122A-C and, optionally, the pump 120. In such an embodiment, the controller 126 may include or be operatively connected with a microwave generator 128 configured to generate and transmit one or more microwave frequencies to the oscillators 122A-C, thereby causing the oscillators 122A-C to oscillate, i.e. vibrate, at a preselected frequency. In some embodiments, the frequency at which the oscillators 122A-C oscillate may range from 1-10000 kHz. According to one embodiment, the oscillators 122A-C may operate at a variety of frequencies within said range in accordance with a predetermined program of operation stored in memory of the controller 126 (as discussed in greater detail below). In other embodiments, the oscillators 122A-C may oscillate at a predetermined frequency within said range. For example, a particular type of polymer 104 may require a low frequency of vibration whereas another type of polymer 104 may require a high frequency of vibration. According to another embodiment, the controller 126 may be configured to operate the oscillators 122A-C at a set frequency with said range for a predetermined period of time. Operations of the system 100 depicted in FIG. 1 will be better understood in conjunction with the methodology illustrated in FIG. 4, discussed in detail below.

Figure 2:
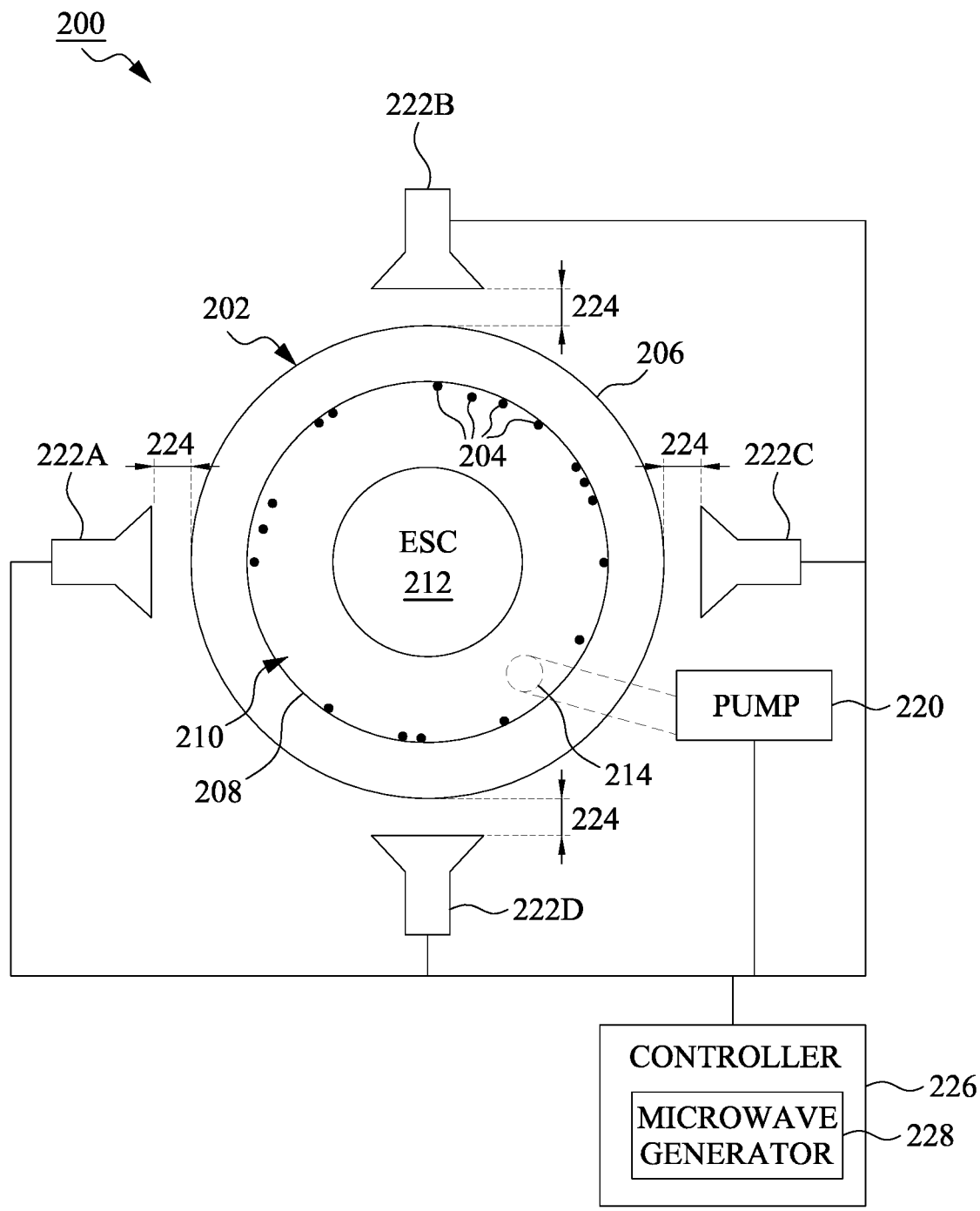
FIG. 2 diagrammatically illustrates a top view of a system for removal of particulates from an etch process chamber in accordance with another embodiment of the subject application.

Turning now to FIG. 2, there is shown a top view of a second embodiment of the subject system and method for particulate removal from an etch process chamber. The system 200 depicted in FIG. 2 illustrates a process chamber 202 that includes an outer wall 206 and an inner wall 208, with the inner wall 208 defining a cavity 210 in which etching processes may be performed. As shown in FIG. 2, the cavity 210 includes an electrostatic chuck (ESC) or other suitable type of wafer mount 212 that is configured to retain a semiconductor wafer (not shown) in position during an etching process.

As shown within the cavity 210 of the chamber 202, a plurality of particulates 204 is illustrated adhering to the inner wall 208. As discussed above, the particulates 204 often float or are suspended in the cavity 210 due to interactions with high energy plasma ion particles when the etching process is active. After the process has completed, as discussed above, the suspended contaminating particles 204 fall or stick to the inner chamber walls 208. As with the process chamber 102 of FIG. 1, the chamber 202 of FIG. 2 may include one or more inlets (not shown) through which a gas (e.g., oxygen, nitrogen, etc.) may be injected into the cavity 210 to assist in removal of free floating particulates 204.

The system 200 of FIG. 2 also includes an associated pump 220, which is positioned outside the chamber 202 and in fluidic connection with the cavity 210 via an outlet 214 located on the bottom of the cavity 210. It will be understood that the positioning of the outlet 214 may be dependent upon a variety of factors including, for example and without limitation, size of the chamber, location of the chamber, size of the pump, location of the pump, type of etching, type of particulate, and the like. In varying embodiments, the pump 220 is operative to remove gas and any collected particles 204 from the chamber 202. It will be appreciated that the inflow of gas (not shown) and the pump 220 may be operative while a semiconductor wafer is present within the chamber 202, or may be operative after the etching process has completed and the semiconductor wafer has been removed.

FIG. 2 illustrates a plurality of oscillators 222A, 222B, 222C, and 222D that are positioned around the outside of the chamber 202. It will be appreciated by those skilled in the art that the number of oscillators 222A-D depicted in FIG. 2 is intended merely to illustrate one example implementation, and the subject systems and methods described herein may include any number of oscillators 222A-D. Furthermore, the positioning of the oscillators 222A-D around the perimeter of the chamber 202 shown in FIG. 2 is merely intended to illustrate their position outside the chamber 202, and not intended to limit their respective positions with respect to the chamber 202. That is, the position of the oscillators 222A-D, along with the number thereof, may vary in accordance with a myriad of factors including, for example and without limitation, the size of the chamber 202, the location of the chamber 202 within a facility, the type of chamber 202, the size of the oscillators 222A-D, and the like.

As shown in FIG. 2, each oscillator 222A-D is positioned outside the outer chamber wall 206, with a suitable gap 224 between each respective oscillator 222A-D and the outer chamber wall 206. The oscillators 222A-D may be coupled to a frame or jacket (not shown) surrounding the chamber 202, such that the oscillators 222A-D are not in direct or indirect physical contact with the outer chamber wall 206. In accordance with another embodiment, each oscillator 222A-D is individually mounted to the outer chamber wall 206 via a bracket (not shown). In such an embodiment, the bracket (not shown) maintains the position of the respective oscillator 222A-D relative to the chamber 202 and the gap 224. The gap 224 may be an air gap, or may be filled with another medium that transmits the oscillations to the chamber 202. In varying embodiments contemplated herein, the gap 224 between the oscillators 222A-D relative to the outer chamber wall 206 may vary in accordance with the type of oscillator 222A-D used, and in some non-limiting examples, be from 1 mm to 30 mm.

In accordance with one embodiment, the oscillators 222A-D are operated in response to the output of a microwave generator 228 of (or operatively connected with) a controller 226. The oscillators 222A-D may include, for example and without limitation, a transducer, a piezoelectric element, a vibrator, or the like configured to vibrate polymer particles 204 from the inner chamber walls 208. Upon dispersal from the walls, the polymer particles 204 may be removed from within the cavity 210 of the chamber 202 via operation of the pump 220. Operations of the pump 220 and oscillators 222A-D may be performed simultaneously in accordance with one embodiment of the subject application. According to varying embodiments contemplated herein, the one or more oscillators 222A-D may operate in varying sequences, simultaneously, in varying pairs (e.g., opposites), or any such suitable variation of operation where one or more oscillators 222A-D vibrate polymer materials 204 loose from one or more inner chamber walls 208.

Figure 3:
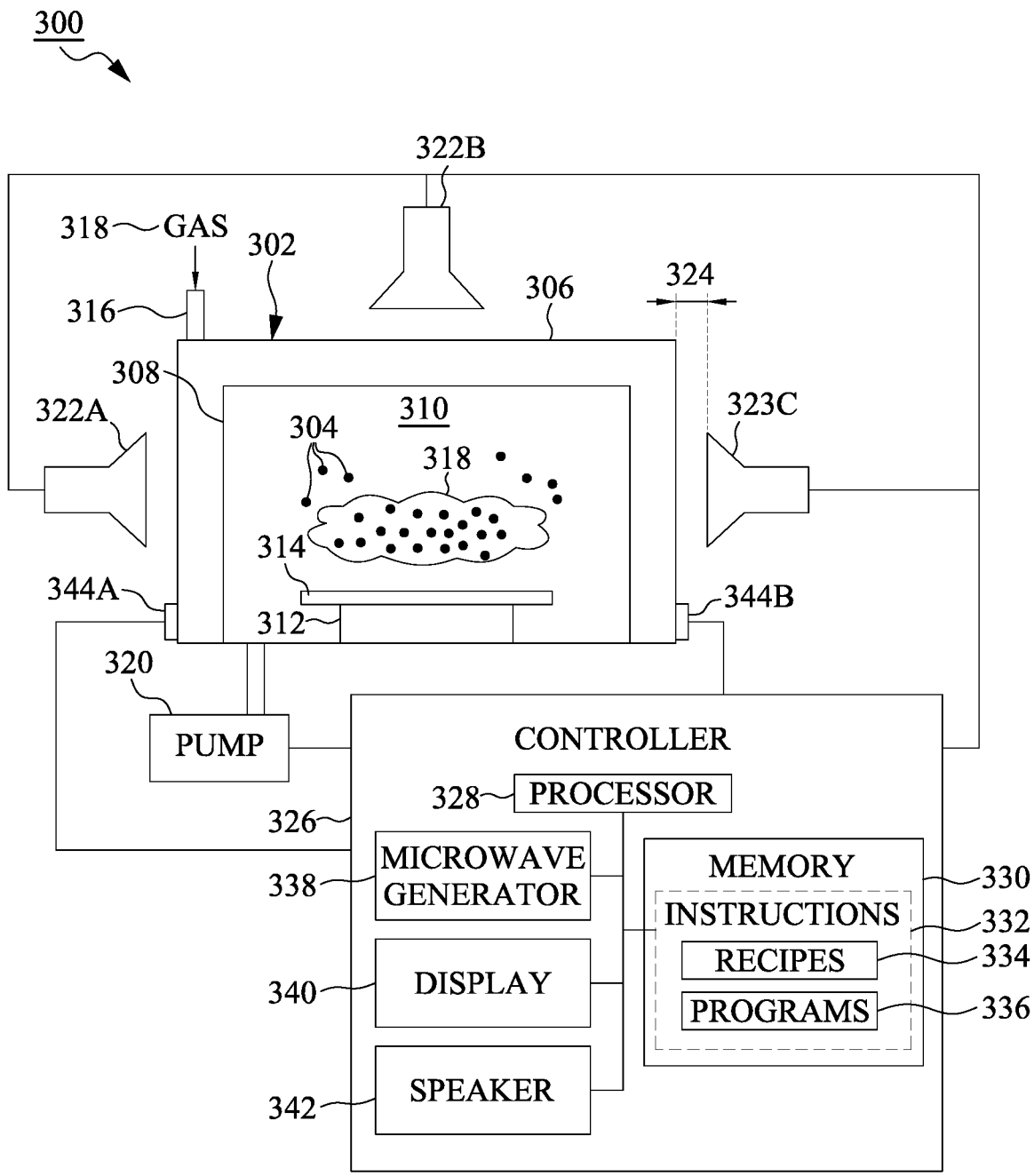
FIG. 3 diagrammatically illustrates a system for removal of particulates from an etch process chamber in accordance with another embodiment of the subject application.

With reference now to FIG. 3, there is shown another embodiment of a system for removal of particulates from an etch process chamber. The system 300 comprises an etching chamber 302 and controller 326, as described hereinafter. The chamber 302 includes an outer wall 306 and an inner wall 308. The inner wall 308 defines a cavity 310 within the chamber 302 in which etching processes may be performed. As shown in FIG. 3, the chamber 302 includes an electrostatic chuck (ESC) or other type of wafer mount 312 disposed within the cavity 310 and configured to retain a semiconductor wafer 314 therein. As with FIGS. 1-2, FIG. 3 illustrates the location of particulates, e.g. polymers 304, within the cavity 310 left after (or during) an etching process. It will be appreciated that the wafer 314 is illustrated in FIG. 3 merely to demonstrate the position of the wafer 314, and operations of the system 300 generally occur without said wafer 314 within the chamber 302.

FIG. 3 also illustrates an inlet 316 into which a gas 318 is injected into the cavity 310 of the chamber 302, collecting some of the polymers 304 formed during the etching process. The gas 318 flowing into the cavity 310 may be Oxygen, Nitrogen, or other suitable gas. A pump 320 is positioned outside the chamber 302 and in fluidic connection with the cavity 310. In varying embodiments, the pump 320 is operative to remove the gas 318 and any collected particles 304 from the chamber 302. As with the systems 100, 200 of FIGS. 1 and 2, the gas 318 and pump 320 may be operative with and without a semiconductor wafer 314 present within the chamber 302.

The system 300 of FIG. 3 includes one or more, including a plurality of oscillators 322A, 322B, and 322C located outside of the chamber 302. The number and position of the oscillators 322A-C are depicted in FIG. 3 for exemplary purposes only, and any number and position is contemplated herein. Accordingly, while shown as being located opposite each other and one above the chamber 302, the position of the oscillators 322A-C, along with the number thereof, may vary in accordance with a myriad of factors including, for example and without limitation, the size of the chamber 302, the location of the chamber 302 within a facility, the type of chamber 302, the size of the oscillators 322A-C, and the like.

Each oscillator 322A-C is positioned with a suitable gap 324 from the outside the outer chamber wall 306. In varying embodiments contemplated herein, the gap 324 between the oscillators 322A-C relative to the outer chamber wall 306 may vary in accordance with the type of oscillator 322A-C used, and in some non-limiting examples, be from 1 mm to 30 mm. The oscillators 322A-C may be affixed to a frame or jacket (not shown) surrounding the chamber 302, such that the oscillators 322A-C are not in direct or indirect physical contact with the outer chamber wall 306. In accordance with another embodiment, each oscillator 322A-C is individually mounted to the outer chamber wall 306 via a bracket (not shown). In such an embodiment, the bracket (not shown) is in physical contact with the outer chamber wall 306, while maintaining the gap 124 between the respective oscillators 122A-C and the chamber 302. The gap 324 may be an air gap or may be filled with another medium that transmits the oscillations to the chamber 302. The oscillators 322A-C may include, for example and without limitation, a transducer, a piezoelectric element, a vibrator, or the like configured to mechanically vibrate polymer particles 304 from the inner chamber walls 308. Upon dispersal from the walls, the polymer particles 304 may be removed from within the cavity 310 of the chamber 302 via operation of the pump 320. According to varying embodiments contemplated herein, the one or more oscillators 322A-C may operate in varying sequences, simultaneously, in varying pairs (e.g., opposites), or any such suitable variation of operation where one or more oscillators 322A-C vibrate polymer materials 304 loose from one or more inner chamber walls 308.

As shown in FIG. 3, the system 300 further includes a controller 326, in electronic communication with the oscillators 322A-C and the pump 320. The controller 326 includes an electronic processor 328 (e.g., comprising a microprocessor, microcontroller, or so forth) in communication with various components, including, for example and without limitation memory 330, a microwave generator 338, a display 340, and a speaker 342 (or other auditory means). The processor 328, which may perform the exemplary methods (described below) via execution of processing instructions 332 that are stored in memory 330 connected to the processor 328. According to one embodiment, the controller 326 includes hardware, software, and/or any suitable combination thereof, configured to interact with the oscillators 322A-C, the pump 320, the chamber 302, and the like.

The memory 330 may represent any type of non-transitory computer readable medium such as random access memory (RAM), read only memory (ROM), magnetic disk or tape, optical disk, flash memory, or holographic memory. In one embodiment, the memory 330 comprises a combination of random access memory and read only memory. In some embodiments, the processor 328 and the memory 330 may be combined in a single chip. The processor 328 can be variously embodied, such as by a single core processor, a multi-core processor, cooperating math coprocessor, a digital controller, or the like. The processor 328, in addition to controlling operations of the controller 326, microwave generator 338, executes instructions 330 stored in memory 330 for performing the method set forth hereinafter.

During operations of the system 300 illustrated in FIG. 3, the controller 326 may utilize recipes 334 and programs 336 to determine the appropriate frequency, duration, and operation of the oscillators 322A-C in accordance with varying embodiments of the subject application. In accordance with one embodiment, the controller 326 may identify the recipe 334 used in the etching process to determine the recipe's polymer performance. That is, the processor 328 determines the photoresist percentage and polymer ratio of a given recipe 334 to determine the relative amounts of particulates, e.g. polymer 304, removed or etched onto a wafer 314. Table 1 below illustrates various example recipes:

TABLE 1

| Recipe Groups | RCP Name | PD % | Polymer |
|---|---|---|---|
| THK: A | A1 | >50% | 3.6 |
| | A2 | <50% | 1.8 |

TABLE 1-continued

| Recipe Groups | RCP Name | PD % | Polymer |
|---|---|---|---|
| THK: B | B1 | >37% | 2.2 |
| | B2 | <37% | 1.1 |
| THK: C | C1 | >69% | 1.8 |
| | C2 | <69% | 0.9 |
| THK: D | D1 | >57% | 0.4 |
| | D2 | <57% | 0.2 |

In Table 1, the pattern density ("PD") may correspond to the photoresist percentage of the entire wafer, and the polymer referring to the type of byproduct resulting from the etching process. Using this identification of the recipe 334 used, the processor 336 retrieves from memory 330 the corresponding cleaning program 336 dictating the performance of the oscillators 322A-C to remove particulates 304 from the inner walls 308 of the chamber 302. In accordance with one embodiment, each program 336 may include indicia as to the appropriate frequency (e.g. high frequency, low frequency, modulating frequency, etc.) of oscillator 322A-C operation, the duration of such operation, any variations to activation of oscillators 322A-C (e.g., sequential, simultaneous, pairs, etc.), flow of gas 318, activation of the pump 320, length of time oscillators 322A-C vibrate, times to start/stop gas 318 and/or pump 320, and the like. For example, when the processor 328 identifies a recipe D1 in the group THK:D, the processor 328 determines the type and likely amount of material (e.g. polymer 304) potentially coating the inner wall 308. Using this particular identification, the processor 328 retrieves the corresponding program 336 associated with this recipe 334. Thereafter, the processor 328 directs the microwave generator 338 to generate a microwave of a preselected frequency (e.g., within 1 kHz-10000 kHz) for predetermined period of time (e.g., from approximately 30-300 seconds). Concurrently, the processor 328 directs the gas inlet 316 to open and inject gas 318 into the cavity 310 and simultaneously activate the pump 320 to remove particulates 304 vibrated off the surface of the inner wall 308 via the oscillators 322A-C collected in the gas 318.

The controller 326 of FIG. 3 may also include a user perceptible output for alerting a user as to the completion of a cleaning cycle, i.e. completion of a program 336 indicating removal of the particulates 304. As shown in FIG. 3, the user perceptible alerting output may include, for example and without limitation, a display 340 to generate visible indicia as to the status of the operation, a speaker 342 to generate an audible indicia as to the status of the operation.

In some embodiments, the system 300 further includes one or more sensors 344A, 344B positioned adjacent to or directly in contact with the outer wall 306 of the process chamber 302. In such embodiments, the sensors 344A-B sense the vibrations of the chamber 302 driven by oscillation of the oscillators 322A-C to the chamber 302. In this regard, the inner wall 308 and the outer wall 306 are typically inner and outer walls of the process chamber 302 which typically comprises a steel frame or the like, so that the inner and outer walls 306, 308 vibrate together—hence, measurement of the vibration using the sensors positioned adjacent to or directly in contact with the outer wall 306 effectively measures vibration of the inner wall 308. The sensors 344A-B may more generally be configured to sense the frequency of oscillation of the oscillators 322A-C, the frequency of the vibrations of the chamber 302, or the like. Suitable examples of such sensors 344A-B may comprise MEMS devices, gyroscopic devices, piezoelectric transducers, or other suitable frequency and/or vibration monitoring devices. In some embodiments, the output of the sensors 344A-B may be communicated to the processor 328 of the controller 328. The controller 328 may then alter the frequency output by the microwave generator 338 to the oscillators 322A-C to increase, decrease, or otherwise modulate the vibrations imparted to the inner wall 308 of the chamber 302. In other embodiments, the output of the sensors 344A-B may be used by the processor 328 to determine the effectiveness of the cleaning cycle, e.g., a change in frequency resulting from successful removal of particles (polymers) 304 from the inner wall 308. Operations of the system 300 of FIG. 3 will be better understood in conjunction with the method 500 set forth in FIG. 5, discussed in greater detail below.

Figure 4:
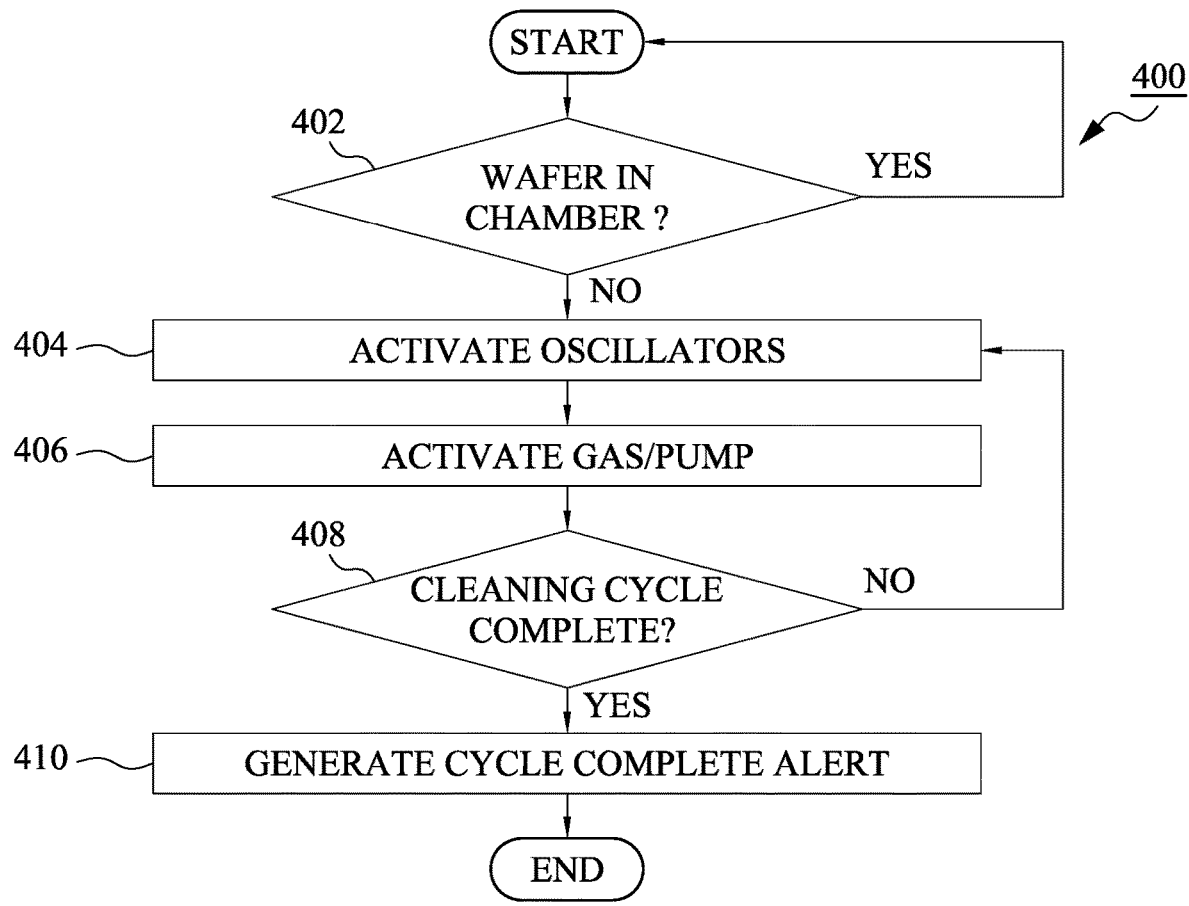
FIG. 4 illustrates a flowchart of a method for removal of particulates from an etch process chamber in accordance with one embodiment of the subject application.

Turning now to FIG. 4, and with continued reference to the system 100 of FIG. 1, there is shown a method 400 illustrating one method for cleaning an etch process chamber 102 in accordance with one embodiment of the subject application. In accordance with varying embodiments, the cleaning of the process chamber 102 may occur at varying intervals, e.g. hourly, daily, weekly, bi-weekly, monthly, bi-monthly, cyclically, batch processing, or the like, after a preset number of wafers 114 have passed through the etching process, or as needed. The method 400 begins at 402, whereupon a determination is made whether a semiconductor wafer 114 is present on the electrostatic chuck or other type of wafer mount 112 located in the cavity 110 of the chamber 102. Upon a determination that a wafer 114 is present in the chamber 102, operations return to start until such time as no wafer 114 is present. When it is determined at 402, via the controller 126 or other suitable mechanism or user involvement, that no wafer 114 is present on the electrostatic chuck or other type of wafer mount 112, operations proceed to 404.

At 404, the controller 126, via the microwave generator 128, activates the oscillators 122A-C to vibrate a predetermined frequency in accordance with the output of the microwave generator 128. At 406, the controller 126 or other suitable control activates the gas inlet 116 enable gas 118 to flow into the cavity 110 along with the pump 120 to pump out the gas 118 and particulates/polymers 104 mechanically vibrated off the inner wall 108 by the oscillators 122A-C. A determination is then made at 408 whether the cleaning cycle has completed. In accordance with one embodiment, the controller 126 operates the oscillators 122A-C, inlet 116, and pump 120 for a predetermined time interval. If the time interval has not lapsed, as determined at 408, operations return to 404 and 406 for continued operations of the aforementioned components. When it is determined at 408 that the cleaning cycle has completed, operations progress to 410, whereupon a cycle complete alert is generated via auditory or visual indicia indicating that the polymer cleaning of the process chamber 102 has concluded.

Figure 5:
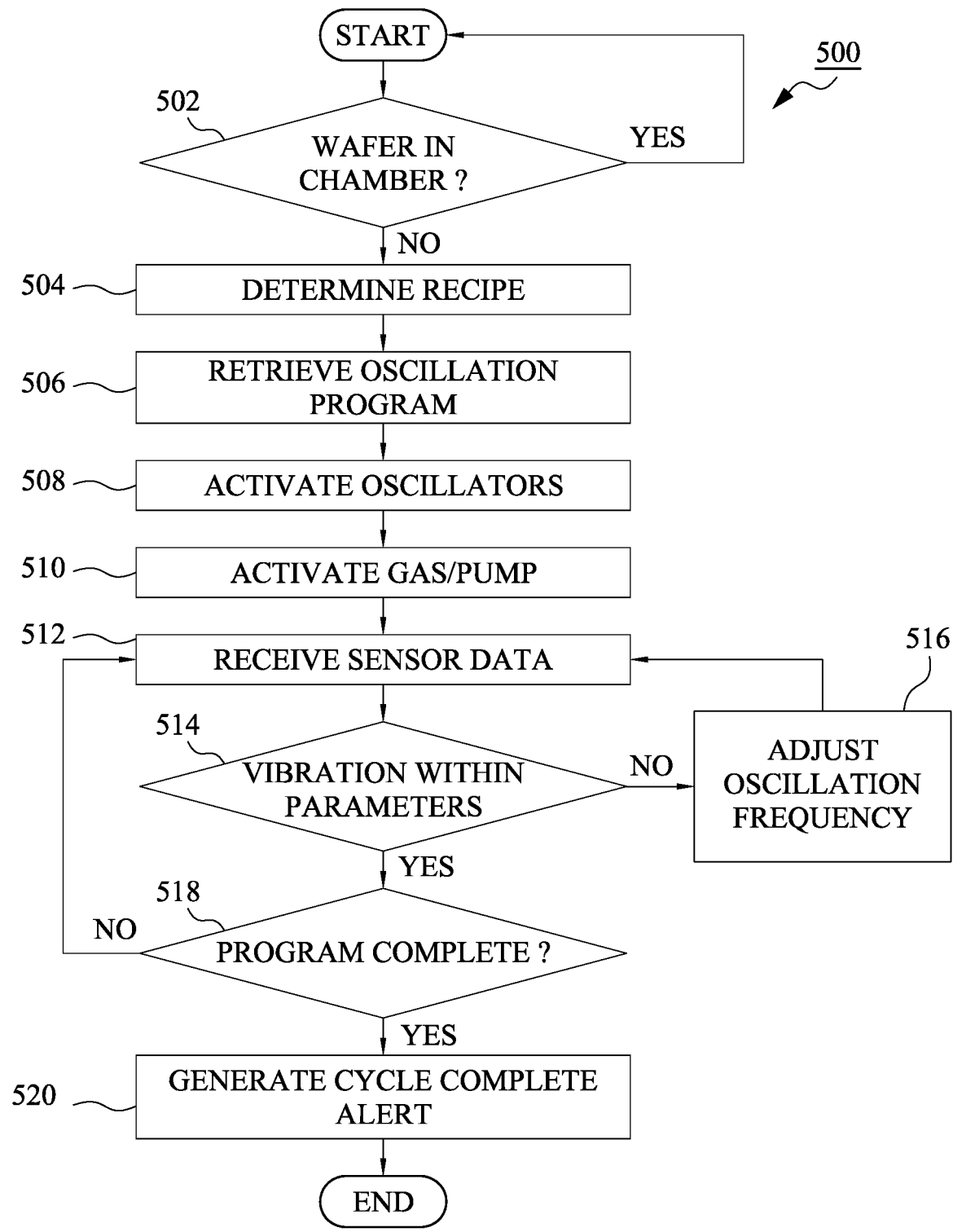
FIG. 5 illustrates a flowchart of a method for removal of particulates from an etch process chamber in accordance with another embodiment of the subject application.

Referring now to FIG. 5, and with reference to the system 300 of FIG. 3, there is shown another embodiment of a method 500 for polymer removal from a process chamber 302 in accordance with the subject application. The method 500 of FIG. 5 begins at 502, whereupon a determination is made whether a semiconductor wafer 314 is present on the electrostatic chuck or other type of wafer mount 312 within the process chamber 302. According to one embodiment, such a determination may be made by an operator of the chamber 302, or alternatively via operation of the controller 326 detecting the presence or absence of a wafer 314 within the chamber 302. Upon a positive determination at 502, operations progress to 504. At 504, the processor 328 determines the recipe 334 used during the etching process of the chamber 302. In some embodiments, the processor 328 identifies the recipe 334 from memory 330. In other embodiments, the recipe 334 used by the process chamber 302 is input via other means. According to varying embodiments contemplated herein, the polymer 304 utilized indicated by the recipe 334 may be a high polymer etch process, a low polymer etch process, or the like, as set forth in Table 1 above.

At 506, the processor 128 retrieves an oscillation program 336 from memory 330 corresponding to the identified recipe 334. In varying embodiments, the oscillation program 336 includes, for example and without limitation, oscillation frequency, oscillator 322A-C sequence of operation (if applicable), oscillation duration, and the like. After retrieval of the corresponding program 336, the processor 128 begins execution of said program 336 by activating the designated oscillators 322A-C at 508. That is, the processor 328 directs the microwave generator 338 to begin generation of microwaves at the predetermined frequency(ies) as indicated by the program 336. According to one embodiment, a high polymer product may utilize higher frequency microwaves, whereas a low polymer product may utilize lower frequency microwaves.

The processor 328, at 510, activates the inlet 318 to allow gas 318 to flow into the cavity 310 and the pump 320. It will be appreciated that steps 508 and 510 may occur sequentially or simultaneously. During operations of steps 508 and 510, the oscillators 322A-C cause vibrations within the chamber 302, affecting the inner walls 308. This vibration causes any particulates/polymers 304 adhering to the wall 108 to fall into the flow of gas 318 inside the chamber 302. The pump 320 pulls or sucks the gas 318 and polymers 304 out of the cavity 310, thereby cleaning the cavity 310 of any residual polymers 304 from etching processes performed by the chamber 302.

Sensor data is then received by the processor 328 from sensors 344A-B at 512 regarding vibration frequency and operations of the cleaning cycle. A determination is then made at 514 whether the vibrations detected by the sensors 344A-B are within parameters set forth in the cleaning program 336 in operation. When it is determined that the vibration, e.g., frequency, is not within the parameters dictated by the executed program 336, operations proceed to 516, whereupon the processor 328 adjusts the output of the microwave generator 338 to produce the required oscillation frequency. Operations then return to 512 for continued monitoring of the vibration of the chamber 302. Upon a positive determination at 514, operations proceed to 518, whereupon a determination is made by the processor 328 whether the program 336 has completed. When the predetermined time interval or sequence of operation set forth in the program 336 has not yet been completed, operations return to 512 for continued monitoring via the sensors 334A-B. When it is determined at 518 that the cleaning program 336 has completed, operations progress to 520. At 520, a cycle complete alert is generated via visual or auditory indicia, utilizing the corresponding display 340 or speaker 342.

According to one embodiment, an etch apparatus comprises a chamber that has an inner wall and an outer wall, with the inner wall defining a cavity disposed within the chamber. The etch apparatus further comprises at least one oscillator that is configured to impart a vibration to the inner wall of the chamber. In addition, the etch apparatus comprises a microwave generator in communication with the at least one oscillator and configured to drive oscillation of the at least one oscillator to impart vibration to the inner wall of the chamber.

According to a second embodiment, a system for removal of particulates from an etch process chamber is disclosed. The system includes a chamber that comprises an inner wall and an outer wall, the inner wall defining a cavity disposed within the chamber. The system further comprises a controller comprising a processor in communication with memory and at least one oscillator positioned a predetermined distance defining a gap from the outer wall. The system further comprises a microwave generator in communication with the processor and the at least one oscillator. The microwave generator is configured to operate the at least one oscillator at a preselected frequency. The memory in communication with the processor stores at least one recipe corresponding to a polymer used during an associated etch process by the chamber and at least one program associated with the at least one recipe corresponding to an operation of the at least one oscillator at a preselected frequency for a predetermined period of time.

According to a third embodiment, a method of removing particulates from an inner wall defining a cavity of an etch process chamber comprises vibrating the inner wall of the etch process chamber using at least one oscillator driven at a preselected frequency by a microwave generator, with the at least one oscillator positioned a predetermined distance from an outer wall of the etch process chamber. The method further comprises enabling a flow of gas into the cavity, the gas collecting particulates removed from the inner wall by vibration of the inner wall. The method also comprises activating a pump in fluid communication with the cavity defined by the inner wall of the etch process chamber to remove the gas and collected particulates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of removing particulates from an inner wall defining a cavity of an etch process chamber, the method comprising:
   vibrating the inner wall of the etch process chamber using at least one oscillator driven at a preselected frequency by a microwave generator, the at least one oscillator positioned a predetermined distance from an outer wall of the etch process chamber;
   enabling a flow of gas into the cavity, the gas collecting particulates removed from the inner wall by the vibration of the inner wall; and
   activating a pump in fluid communication with the cavity defined by the inner wall of the etch process chamber to remove the gas and collected particulates,
   wherein the particulates correspond to a polymer resulting from an etch process performed in the etch process chamber, the method further comprising:
   determining, from a memory in communication with a processor, at least one recipe corresponding to a polymer used during an associated etch process by the chamber;
   retrieving, from the memory, at least one program associated with the at least one recipe corresponding to an operation of the at least one oscillator at a preselected frequency for a predetermined period of time; and
   operating at least one of the pump and the at least one oscillator in accordance with the retrieved program.

2. The method of claim 1, further comprising:
   receiving an output from at least one sensor positioned on the outer wall of the process chamber, the output indicative of the frequency of vibration of the at least one oscillator; and
   responsive to the output, adjusting the microwave generator to alter a frequency of vibration of the at least one oscillator.

3. The method of claim 1, wherein the pump and the at least one oscillator operate simultaneously in accordance with the retrieved program.

4. The method of claim 1, wherein the at least one oscillator and the pump operate sequentially in accordance with the retrieved program.

5. The method of claim 1, wherein the at least one oscillator comprises a plurality of oscillators positioned around the outer wall, which are operated in accordance with the retrieved program simultaneously, sequentially, or in varying order.

6. The method of claim 5, wherein the plurality of oscillators vibrate at a same frequency or at plurality of different frequencies.

7. The method of claim 1, further comprising generating an alert indicating completion of removal of the collected particulates.

8. A method of removing particulates from an inner wall defining a cavity of an etch process chamber, the method comprising:
   vibrating the inner wall of the etch process chamber using at least one oscillator driven at a preselected frequency by a microwave generator, the at least one oscillator positioned a predetermined distance from an outer wall of the etch process chamber;
   enabling a flow of gas into the cavity, the gas collecting particulates removed from the inner wall by the vibration of the inner wall;
   activating a pump in fluid communication with the cavity defined by the inner wall of the etch process chamber to remove the gas and collected particulates;
   receiving an output from at least one sensor positioned on the outer wall of the process chamber, the output indicative of the frequency of vibration of the at least one oscillator; and
   responsive to the output, adjusting the microwave generator to alter a frequency of vibration of the at least one oscillator.

9. The method of claim 8, wherein the particulates correspond to a polymer resulting from an etch process performed in the etch process chamber, the method further comprising:
   determining, from a memory in communication with a processor, at least one recipe corresponding to a polymer used during an associated etch process by the chamber;
   retrieving, from the memory, at least one program associated with the at least one recipe corresponding to an operation of the at least one oscillator at a preselected frequency for a predetermined period of time; and
   operating at least one of the pump and the at least one oscillator in accordance with the retrieved program.

10. The method of claim 9, wherein the at least one oscillator comprises a plurality of oscillators positioned around the outer wall, which are operated in accordance with the retrieved program simultaneously, sequentially, or in varying order.

11. The method of claim 10, wherein the plurality of oscillators vibrate at a same frequency or at plurality of different frequencies.

12. The method of claim 8, further comprising generating an alert indicating completion of removal of the collected particulates.

13. The method of claim 8, wherein the predetermined distance defines a gap between the at least one oscillator and the outer wall.

14. A method of removing particulates from an inner wall defining a cavity of an etch process chamber, the method comprising:
   determining, from a memory in communication with a processor, at least one recipe corresponding to a polymer used during an associated etch process by the chamber;
   retrieving, from the memory, at least one program associated with the at least one recipe corresponding to an operation of at least one oscillator at a preselected frequency for a predetermined period of time;
   vibrating the inner wall of the etch process chamber using the at least one oscillator driven at the preselected frequency by a microwave generator in accordance with the retrieved at least one program, the at least one oscillator positioned a predetermined distance from an outer wall of the etch process chamber;
   enabling a flow of gas into the cavity, the gas collecting particulates removed from the inner wall by the vibration of the inner wall; and
   activating a pump in fluid communication with the cavity defined by the inner wall of the etch process chamber to remove the gas and collected particulates.

15. The method of claim 14, wherein the at least one oscillator comprises a plurality of oscillators positioned around the outer wall, which are operated in accordance with the retrieved program simultaneously, sequentially, or in varying order.

16. The method of claim 15, wherein the plurality of oscillators vibrate at a same frequency or at plurality of different frequencies.

17. The method of claim 15, wherein the predetermined distance defines a gap between the at least one oscillator and the outer wall.

18. The method of claim 15, wherein the pump and the at least one oscillator operate simultaneously in accordance with the retrieved program.

19. The method of claim 15, wherein the at least one oscillator and the pump operate sequentially in accordance with the retrieved program.

20. The method of claim 15, further comprising generating an alert indicating completion of removal of the collected particulates.

* * * * *